US012332188B2

(12) United States Patent
Lee

(10) Patent No.: US 12,332,188 B2
(45) Date of Patent: Jun. 17, 2025

(54) HIGH-PERFORMANCE EUV MICROSCOPE WITH FREE FORM ILLUMINATION SYSTEM

(71) Applicant: ESOL, Inc., Hwaseong-si (KR)

(72) Inventor: Dong Gun Lee, Hwaseong-si (KR)

(73) Assignee: ESOL, Inc., Hwaseong-si (KR)

( * ) Notice: Subject to any disclaimer, the term of this patent is extended or adjusted under 35 U.S.C. 154(b) by 249 days.

(21) Appl. No.: 18/202,301

(22) Filed: May 26, 2023

(65) Prior Publication Data

US 2024/0011922 A1     Jan. 11, 2024

(30) Foreign Application Priority Data

Jul. 7, 2022    (KR) ........................ 10-2022-0083995

(51) Int. Cl.
*G01N 21/956*     (2006.01)
*G03F 7/00*     (2006.01)

(52) U.S. Cl.
CPC ....... *G01N 21/956* (2013.01); *G03F 7/70033* (2013.01); *G03F 7/70983* (2013.01); *G01N 2021/95676* (2013.01)

(58) Field of Classification Search
CPC ....... G01N 21/956; G01N 2021/95676; G01N 21/8806; G03F 7/70033; G03F 7/70983; G03F 1/84; G03F 1/22; G02B 21/0016; G02B 17/08; G02B 21/16
See application file for complete search history.

(56) References Cited

U.S. PATENT DOCUMENTS 6,864,490 B1    3/2005   Underwood et al.
2008/0297891 A1*   12/2008   Kim ....................... G02B 21/16
                                                                                   359/389

(Continued)

FOREIGN PATENT DOCUMENTS

KR      10-0850214 B1    8/2008
KR      10-1258344 B1    4/2013
KR      10-1370203 B1    3/2014

(Continued)

OTHER PUBLICATIONS

Office Action of Korean Patent Application No. 10-2022-0083995 dated Sep. 23, 2024.

*Primary Examiner* — Kiho Kim
(74) *Attorney, Agent, or Firm* — Revolution IP, PLLC

(57) ABSTRACT

A high-performance EUV microscope with a free form illumination system, includes: an EUV light source that outputs EUV light; one spherical mirror, which receives and reflects the EUV light outputted from the EUV light source and includes a two-axis drive part for controlling reflection direction of incident light through two-axis angle scan; one plane mirror, which receives the reflected light reflected from the spherical mirror and provides illumination light to a measurement target, and in which a plurality of mirror cells are arranged at each angle; a zone plate lens for focusing measurement light, which is the illumination light formed through the plane mirror and incident on the measurement target and then reflected; and a photodetector for receiving the measurement light focused by the zone plate lens, wherein a reflection angle of the spherical mirror and a reflection angle of the plane mirror are selectively controlled, respectively.

10 Claims, 7 Drawing Sheets

(56) References Cited

U.S. PATENT DOCUMENTS

2015/0002925 A1  1/2015  Endres et al.
2022/0065797 A1* 3/2022  Terasawa ............. G01N 21/956

FOREIGN PATENT DOCUMENTS

| KR | 10-1606227 B1 | 3/2016 |
| KR | 10-2020-0121545 A | 10/2020 |
| KR | 10-2020-0121546 A | 10/2020 |
| KR | 10-2021-0043701 A | 4/2021 |

* cited by examiner

HIGH-PERFORMANCE EUV MICROSCOPE WITH FREE FORM ILLUMINATION SYSTEM

TECHNICAL FIELD

The present disclosure relates to a high-performance extreme ultraviolet EUV microscope with a free form illumination system and, more particularly, to a high-performance EUV microscope with a free form illumination system, capable of realizing various types of illumination and enabling cost reduction and structural simplification through simplification of an optical system.

BACKGROUND ART

In semiconductor technology development, exposure is a very core process. Recently, EUV lithography technology using a wavelength of 13.5 nm has been applied rather than the existing ArF exposure technology using the existing 193 nm wavelength, and it is possible to perform precision processes by utilizing next-generation EUV lithography equipment.

An EUV pellicle is a thin film that protects an EUV mask and serves to prevent the mask from being contaminated by defects during exposure, so it is a very important material that can improve a pattern formation defect rate during pattern minification. Transmittance of a protection film and uniformity of the transmittance directly affect a semiconductor exposure yield. Therefore, managing the transmittance quality of EUV pellicle materials is very important in the production and management of EUV pellicles.

In addition, since the light reflected from the EUV pellicle causes pattern errors in a portion which overlaps and is exposed to a semiconductor wafer, it is also necessary to manage the reflectivity of the EUV pellicle. Quality management of the transmittance and reflectance of the EUV pellicle is performed through management of transmission/reflection measurement process by using an EUV transmission and reflection measurement device.

Meanwhile, in order to smoothly apply an EUV mask to the process of mass production, as in the ArF mass production technology, it is essential to control the quality of the EUV pellicle through a device for measuring transmittance and reflectance of the EUV pellicle, which is the protective film of an EUV mask. In order to implement such a device, it is necessary to develop a new transmission/reflection measuring device adopting EUV light and an EUV optical system, unlike the conventional ArF transmittance measuring devices.

In a reflectivity measuring device according to a conventional art, an EUV light source of a laser produced plasma LPP type is used, which radiates ND:YAG Q-switched pulse laser beams to a metal target so as to form plasma and generate EUV light, EUV monochromatic light is irradiated to a sample by using a monochromator, which includes an oblique incidence mirror, a grating, and a slit, reflected light and transmitted light are divided by using a beam splitter, the reflected light is detected so as to form a reference signal for monitoring a change in the light source, the transmitted light is reflected from a mask sample so as to form a sample reflection signal on a detector, so that reflectivity of the mask sample is measured using the reference signal and the sample reflection signal.

According to another conventional art, a measuring device for measuring transmittance or reflectance of a measurement target, includes an EUV light source unit based on high-order harmonic generation HHG, a multi-layer ML mirror part having a multi-layered thin film for selecting and reflecting only light of a certain wavelength from light outputted from the EUV light source unit, a transmitted light measuring sensor for measuring light passing through a measurement target after reflected light, which is reflected from the ML mirror part and has the certain wavelength, is irradiated as measurement light to the measurement target.

Meanwhile, FIG. 1 is a block diagram of an EUV microscope device using a free form optical system according to the prior art. Referring to FIG. 1, an inspection device includes a free form illumination system configured to reflect and steer an EUV light source so that angular distribution of incident light has various shapes. In FIG. 1, the device includes a steering mirror MA, a plane mirror MB for reflecting light, which is reflected from the steering mirror MA, and an ellipsoidal mirror MC for irradiating light reflected from the plane mirror to an EUV mask that is a measurement target, wherein light reflected from the measurement target is incident on a detector (CCD) such that the EUV mask is inspected.

The prior art configured as described above has the advantage of being able to implement various free form illumination, but has the disadvantage of requiring expensive aspheric lenses to be applied. In addition, since one aspherical steering mirror and a plane mirror are applied, the uniformity of illumination light is reduced, and there are limitations in controlling various types of illumination structures.

As a result, the conventional inspection device to which the existing free form lighting system is applied still has problems in that an optical system is rather complicated and uses an expensive aspheric lens, resulting in the increase of costs. In particular, it is very difficult to manufacture an aspheric lens, and a large price increase is required.

PRIOR ART DOCUMENTS

Patent Documents

U.S. Pat. No. 6,864,490
Korean Patent Publication No. 10-2020-00121546
Korean Patent Publication No. 10-2020-00121545
US Patent Publication No. 2015-0002925
KR Patent No. 10-1370203
KR Patent Publication No. 10-2021-0043701
KR Patent No. 10-1258344
KR Patent No. 10-1606227

DISCLOSURE

Technical Problem

The present disclosure to solve the above problems aims to provide an EUV microscope device to which a free form illumination system is applied at low cost without using an expensive aspherical optical system.

In particular, the present disclosure aims to provide an illumination system that can secure the uniformity of illumination light in implementing a free form illumination system. Furthermore, the present disclosure aims to provide an illumination system in which an illumination spot size can be easily adjusted by applying a micro-mirror.

Technical Solution

According to the present disclosure to achieve the above purpose, there is provided a high-performance EUV microscope with a free form illumination system, which includes: an EUV light source that outputs EUV light; one spherical mirror, which receives and reflects the EUV light outputted from the EUV light source and includes a two-axis drive part for controlling reflection direction of incident light through two-axis angle scan; one plane mirror, which receives the reflected light reflected from the spherical mirror and provides illumination light to a measurement target, and in which a plurality of mirror cells are arranged at each angle; a zone plate lens for focusing measurement light, which is the illumination light formed through the plane mirror and incident on the measurement target and then reflected; and a photodetector for receiving the measurement light focused by the zone plate lens, wherein a reflection angle of the spherical mirror and a reflection angle of the plane mirror are selectively controlled, respectively, so that illumination light irradiated to the measurement target is controlled.

In addition, the EUV light source is an EUV light source based on high-order harmonic generation HHG.

In addition, the plane mirror is driven at a two-dimensional angle so as to scan illumination light for each position of the measurement target.

In addition, the plurality of mirror cells configured in the plane mirror can be independently controlled in angle so that illumination light of a same angle is irradiated to a same point of the measurement target.

In addition, in order to implement a total light illumination time required for measurement with respect to the same point of the measurement target, free form illumination light is formed through a combination of angles of the mirror cells configured in the plane mirror and the spherical mirror.

In addition, in the case of providing illumination light for different points of the measurement target, angles of the mirror cells configured in the plane mirror are controlled in a state in which angle of the spherical mirror is fixed, so as to provide illumination light to different points of the measurement target.

In addition, an angle of the spherical mirror is controlled so that a position of light incident on the plane mirror is controlled, and an angle of the plane mirror is controlled so that illumination light is irradiated at a same position of the measurement target.

In addition, there is provided a high-performance EUV microscope with a free form illumination system, which includes: an EUV light source that outputs EUV light; one spherical mirror, which receives and reflects the EUV light outputted from the EUV light source and includes a two-axis drive part for controlling reflection direction of incident light through two-axis angle scan; one plane mirror, which receives the reflected light reflected from the spherical mirror and provides illumination light to a measurement target, includes a drive part for adjusting reflection angle of the illumination light, a zone plate lens for focusing measurement light, which is the illumination light formed through the plane mirror and incident on the measurement target and then reflected; and a photodetector for receiving the measurement light focused by the zone plate lens, wherein a reflection angle of the spherical mirror and a reflection angle of the plane mirror are selectively controlled, respectively, so that illumination light irradiated to the measurement target is controlled.

Advantageous Effects

According to the present disclosure configured and operating as described above, the existing free form illumination light can be obtained using only a spherical mirror and a plane mirror without using the existing expensive aspheric lens, resulting in the cost reduction and structure simplification of the optical system.

In addition, according to the present disclosure, uniformity of illumination can be obtained only by using a spherical mirror and a plane mirror, thereby enabling more precise measurement of an EUV mask.

In addition, according to the present invention, a high-performance EUV microscope device with an illumination system having uniform light intensity can be provided by applying a plane mirror having a mirror cell structure.

BEST MODE OF THE INVENTION

Hereinafter, a high-performance EUV microscope with a free form illumination system according to the present disclosure will be described in detail with reference to the accompanying drawings.

According to the present disclosure, a high-performance EUV microscope with a free form illumination system, includes: an EUV light source that outputs EUV light; one spherical mirror, which receives and reflects the EUV light outputted from the EUV light source and includes a two-axis drive part for controlling reflection direction of incident light through two-axis angle scan; one plane mirror, which receives the reflected light reflected from the spherical mirror and provides illumination light to a measurement target, and in which a plurality of mirror cells are arranged at each angle; a zone plate lens for focusing measurement light, which is the illumination light formed through the plane mirror and incident on the measurement target and then reflected; and a photodetector for receiving the measurement light focused by the zone plate lens, wherein a reflection angle of the spherical mirror and a reflection angle of the plane mirror are selectively controlled, respectively, so that illumination light irradiated to the measurement target is controlled.

According to the present disclosure, a high-performance EUV microscope with a free form illumination system has principal technical features in that a free form illumination system is implemented using only one spherical lens and a plane lens without using any expensive aspheric lens and an EUV microscope device is provided for inspecting an EUV mask through this illumination system.

In addition, the present disclosure has technical features in that illumination light of uniform light intensity can be obtained by applying one plane mirror composed of mirror cells and various shapes of illumination light can be implemented.

Figure 1:
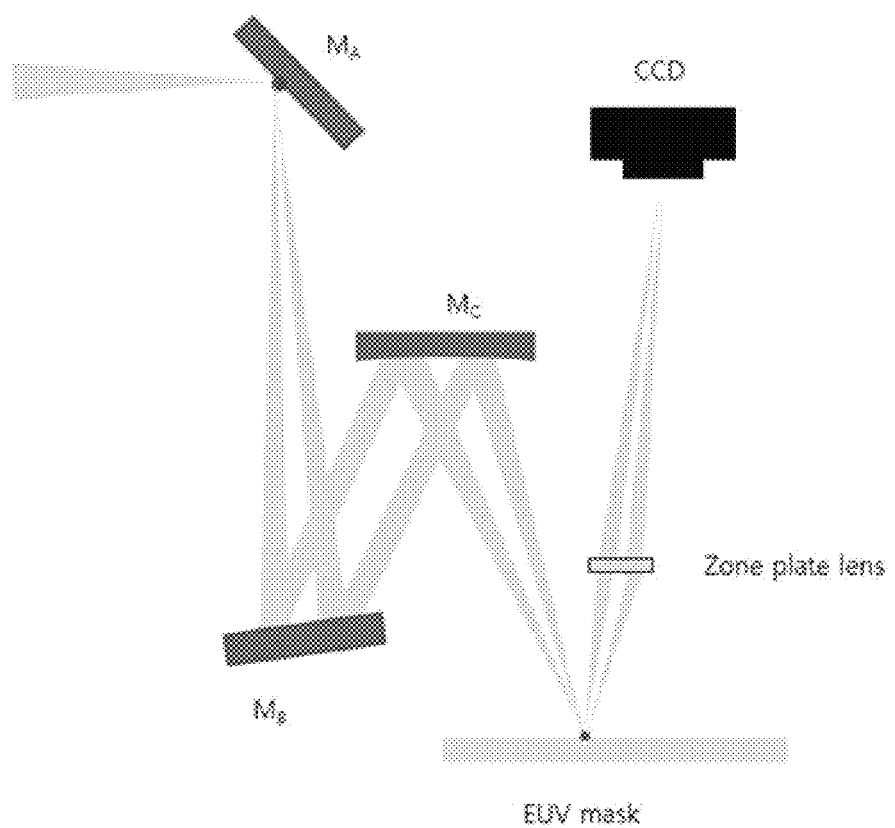
FIG. 1 is a block diagram of a free form illumination system device according to the prior art.
Figure 2:
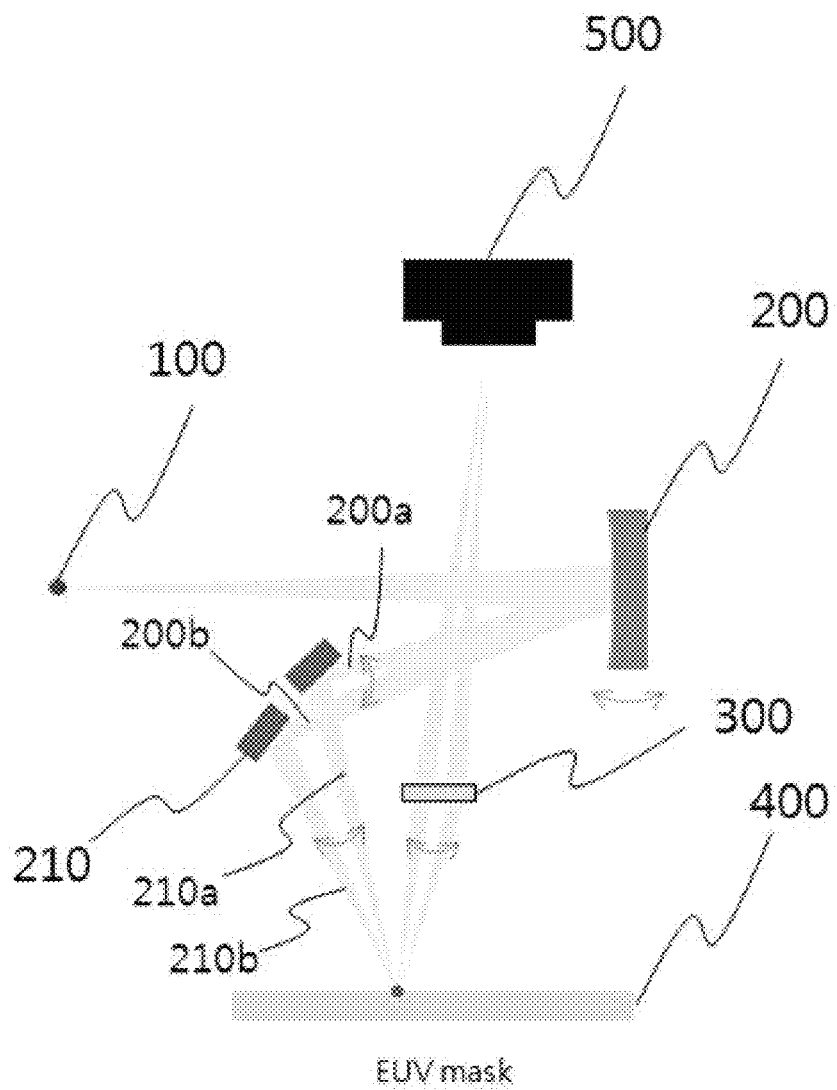
FIG. 2 is an overall block diagram of a high-performance EUV microscope with a free form illumination system according to an embodiment of the present disclosure.

FIG. 2 is an overall block diagram of a high-performance EUV microscope with a free form illumination system according to the present disclosure.

As shown in FIG. 2, a high-performance EUV microscope with a free form illumination system according to the present disclosure includes an EUV light source 100 for providing EUV light, a spherical mirror 200 for focusing light outputted from the EUV light source, a two-dimensional plane mirror 210 for irradiating reflected light to an EUV mask, that is, a measurement target 400, when light focused on the spherical mirror 200 is reflected, a zone plate lens 300 for imaging measurement light reflected from the measurement target 400, and a photodetector 500 for detecting the measurement light transmitted through the zone plate lens.

Preferably, the EUV light source is composed of a light source device that outputs high-order harmonic generation HHG based EUV light or coherent EUV light.

In the present disclosure, in order to implement a free form illumination system in an EUV microscope device, the free form illumination system is formed by a combination of the one spherical mirror 200 and an optical path change means that transmits a beam reflected from the spherical mirror to an EUV mask.

Herein, it is preferable to manufacture the optical path change means by applying a plane mirror 210.

Herein, the spherical mirror 200 is configured with one drive part (not shown) so as to enable scanning at a two-axis angle, and a reflection angle of focused light can be controlled through two-axis angular driving of the spherical mirror.

FIG. 2 shows first spherical surface-reflected light 200a having one axis and second spherical surface-reflected light 200b having one axis different from that of the first spherical surface-reflected light 200a, both being caused by rotation of the spherical mirror, and also shows first plane surface-reflected light 210a that is reflected light of the first spherical surface-reflected light and second plane surface-reflected light 210b that is reflected light of the second spherical surface-reflected light, both being caused through the optical path change means.

In addition, the plane mirror 210 is composed of one two-dimensional array (MEMS mirror array), wherein the plane mirror includes a plurality of mirror cells, and each of the mirror cells can be independently controlled in angle.

In some cases, the plane mirror may be formed of one mirror, in which case, the one plane mirror can change a reflection angle of incident light through rotation.

In order to irradiate light of each angular component of a pupil plane in the plane mirror 210 to a same point of the EUV mask, each of the mirror cells in the EUV mirror array is independently controlled in angle, EUV light is illuminated on the EUV mask by the spherical mirror 200 and the plane mirror 210, and an image of the EUV mask is formed on the photodetector 500 through the zone plate lens.

Therefore, a free form illumination system is implemented on the pupil surface through the two-dimensional angle scan of the spherical mirror, each of the mirror cells of the plane mirror scans illumination on the measurement target (sample) per position through two-dimensional angle scan, so that it is possible to provide a high-performance EUV microscope device that implements illumination of uniform light intensity.

Figure 3:
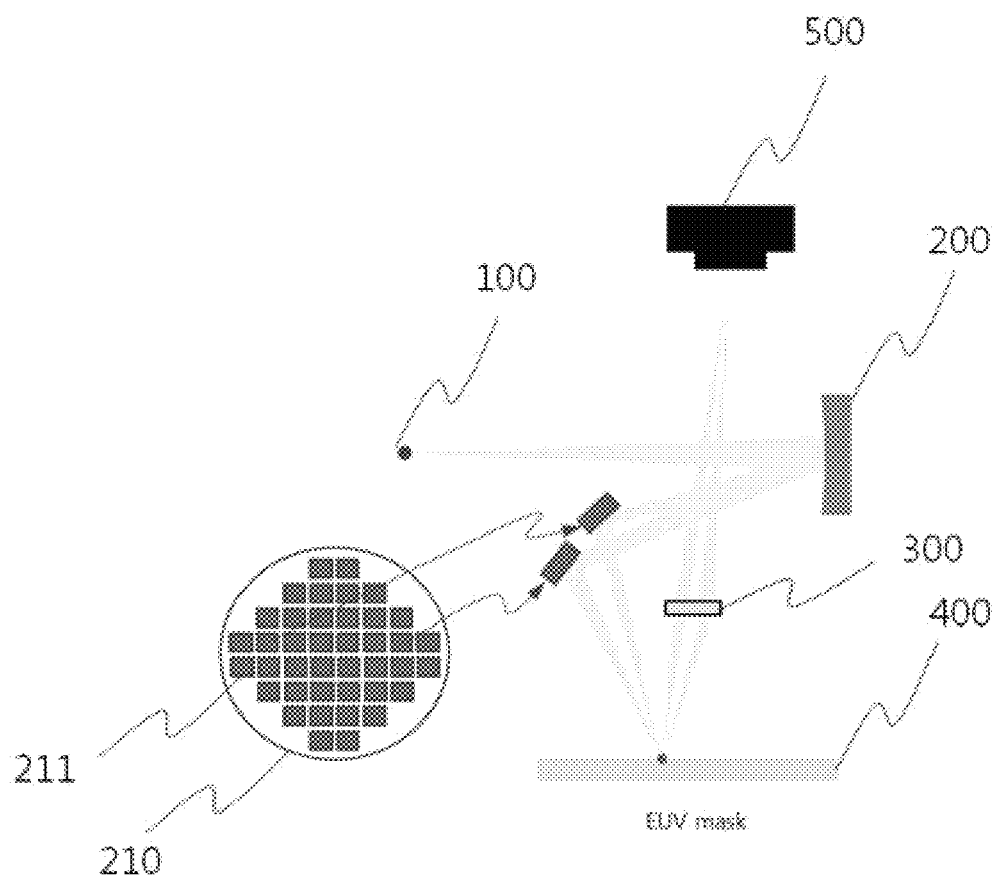
FIG. 3 is a detailed block diagram of a high-performance EUV microscope with a free form illumination system according to the embodiment of the present disclosure.

FIG. 3 is a detailed block diagram of a high-performance EUV microscope with a free form illumination system according to the embodiment of the present disclosure.

As described above with reference to FIG. 2, the plane mirror is a mirror composed of a combination of a plurality of mirror cells 211, and each of the mirror cells 211 can be independently controlled in angle. As shown, the two-dimensional plane mirror 210 has a structure in which the plurality of mirror cells 211 are arranged on a plane, and each of the mirror cells can be independently controlled in angle in order to provide angular component light for a same point of a measurement target.

In addition, the plane mirror 210 can scan illumination per position through two-dimensional angle scanning, and through this, it is possible to provide illumination light with uniform light intensity.

The two-dimensional angle control of the plane mirror and the independent angle control of the mirror cells can similarly be implemented through a separate drive part (not shown).

Therefore, in the present disclosure, in order to implement a total light illumination time required for measurement with respect to a same point of the measurement target, free form illumination light is formed through angle combination of the spherical mirror 200 and the mirror cells configured in the plane mirror 210. In case of providing illumination light to different points of the measurement target, illumination light can be provided to the different points of the measurement target by controlling angles of the mirror cells configured in the plane mirror in a state in which an angle of the spherical mirror is fixed.

Figure 4:
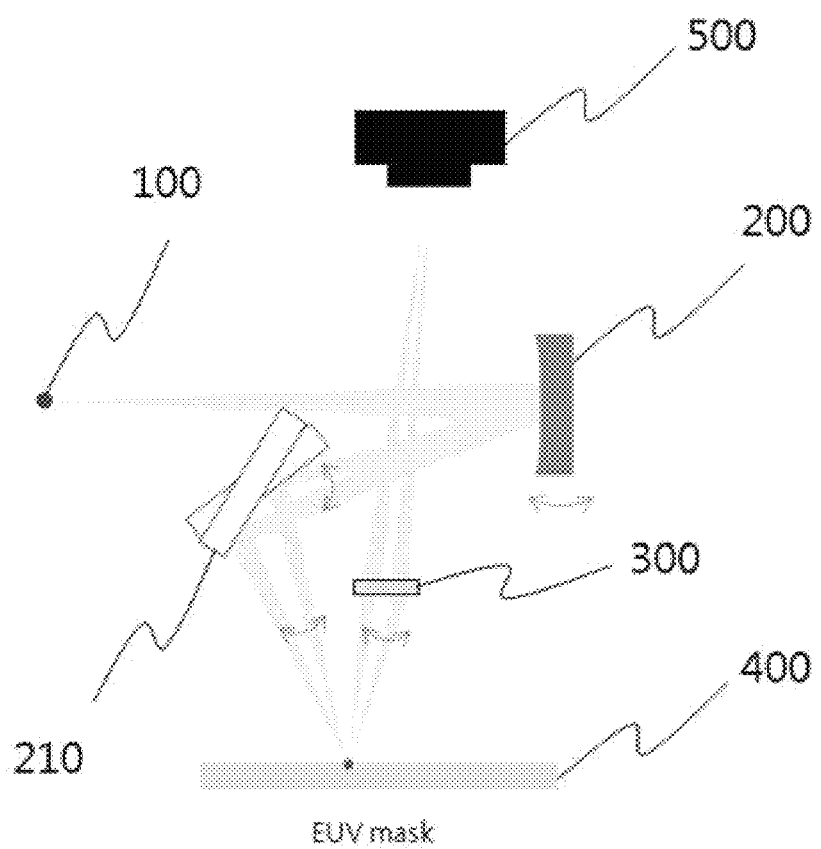
FIG. 4 is a block diagram of a high-performance EUV microscope with a free form illumination system according to another embodiment of the present disclosure.

FIG. 4 is a block diagram of a high-performance EUV microscope with a free form illumination system according to another embodiment of the present disclosure, Referring to FIG. 4, one plane mirror is applied instead of the plane mirror of the mirror cell structure described above, wherein the one plane mirror 210 irradiates illumination to the measurement target per position through two-dimensional angle scan. That is, it is possible to implement a free form illumination system through angle control of the spherical mirror and the plane mirror.

As described above, the present disclosure can inspect an EUV mask at a high speed by implementing a free form illumination system through angular scanning with a combination of one spherical mirror and a plane mirror instead of using an expensive aspheric lens that has been used in the past.

Figure 5:
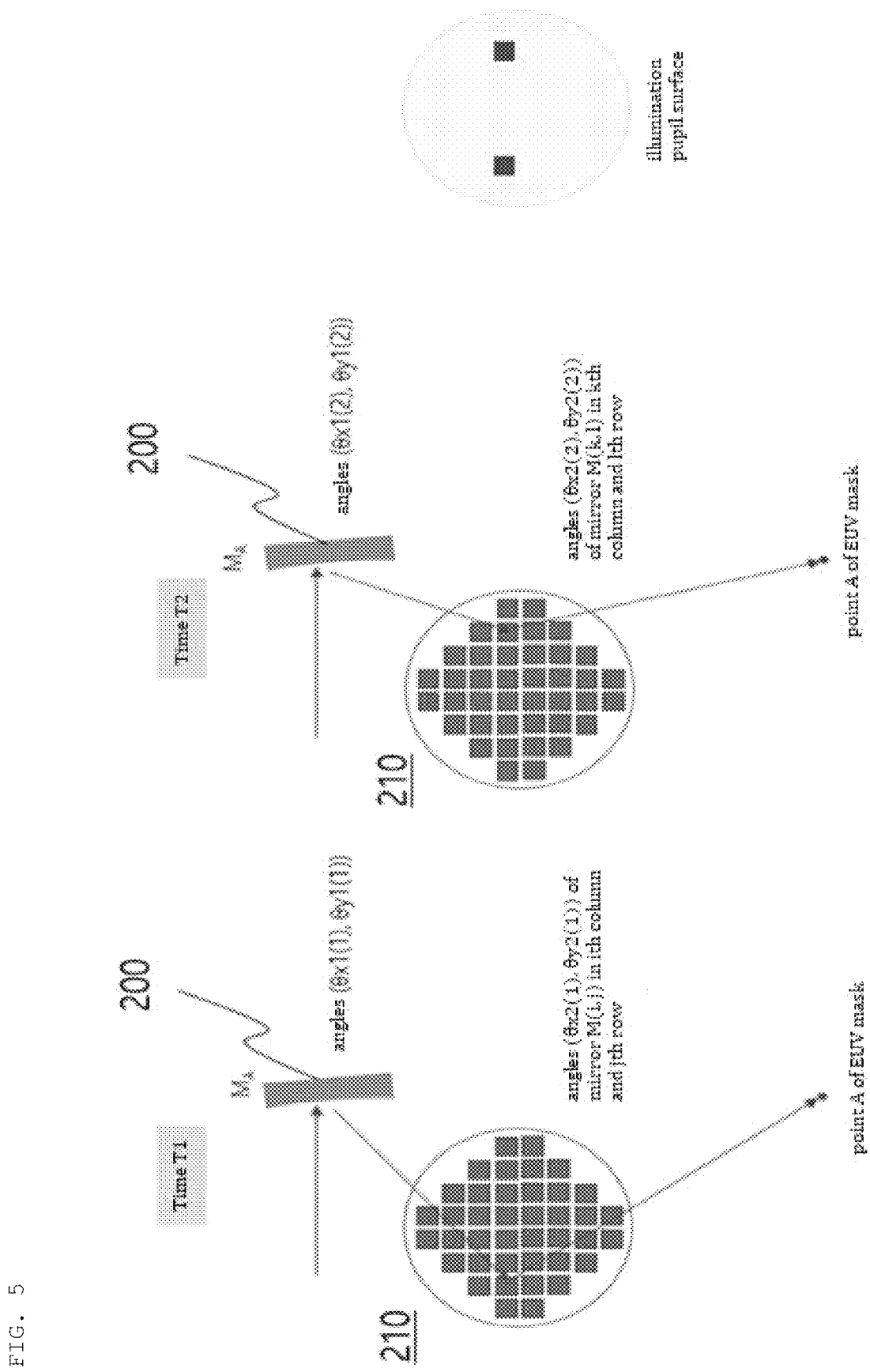
FIG. 5 is a diagram of illumination light of a high-performance EUV microscope with a free form illumination system according to an embodiment of the present disclosure.

FIG. 5 is a diagram of illumination light of a high-performance EUV microscope with a free form illumination system according to an embodiment of the present disclosure.

Free form illumination can be realized by distributing a total light illumination time required for point A of an EUV mask, that is, a measurement target, through an angular combination of a spherical mirror 200 and mirror cells of a plane mirror 210. At each angle condition ($\theta x1(1)$, $\theta y1(1)$), ($\theta x1(2)$, $\theta y1(2)$) of the spherical mirror 200, illumination light is provided to point A of the EUV mask by satisfying conditions for angle ($\theta x2(1)$, $\theta y2(1)$) of a mirror $M(i, j)$ in an ith column and a jth row and angle ($\theta x2(2)$, $\theta y2(2)$) of a mirror $M(k, l)$ in a kth column and an lth row. With the illumination light formed in this way, dipole illumination is implemented on the pupil surface, and the same point A of the EUV mask can be illuminated.

Figure 6:
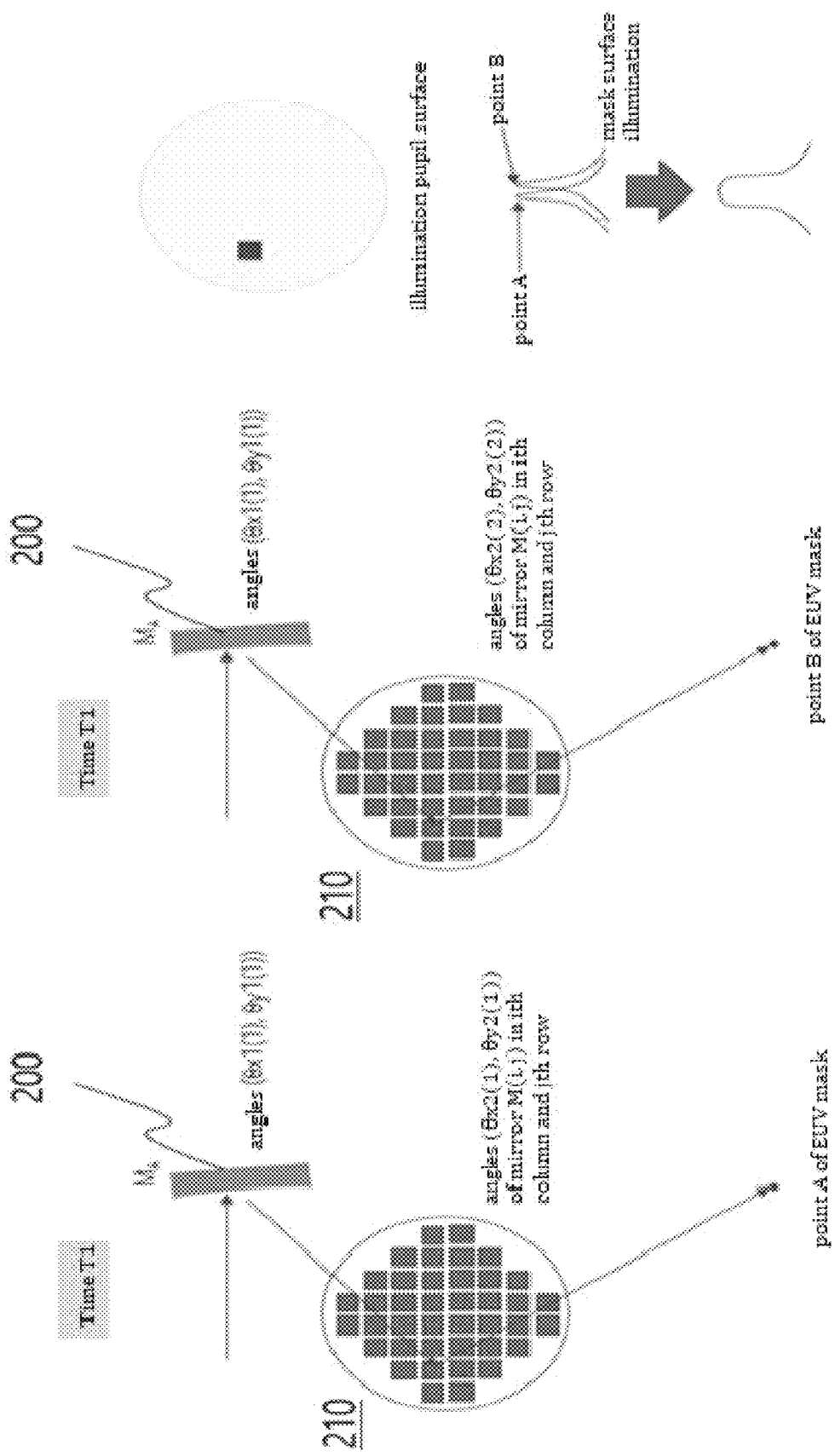
FIG. 6 is a diagram of illumination light of a high-performance EUV microscope with a free form illumination system according to another embodiment of the present disclosure.

FIG. 6 is a diagram of illumination light of a high-performance EUV microscope with a free form illumination system according to another embodiment of the present disclosure. Referring to FIG. 6, in order to irradiate light to different points A and B of the EUV mask, respectively, under the same angle condition of the spherical mirror, at the angle condition ($\theta x1(1)$, $\theta y1(1)$) of the spherical mirror, as a first mirror cell condition, a mirror cell M(1, 1) in an ith column and a jth row has angle ($\theta x2(1)$, $\theta y2(1)$), and as a second mirror cell condition, the mirror cell M(2, 2) in the ith column and the jth row has angle ($\theta x2(2)$, $\theta y2(2)$). Therefore, an image of the EUV mask is formed by accumulating illumination light for each position of point A and point B, and thus uniform illumination light can be provided.

Figure 7:
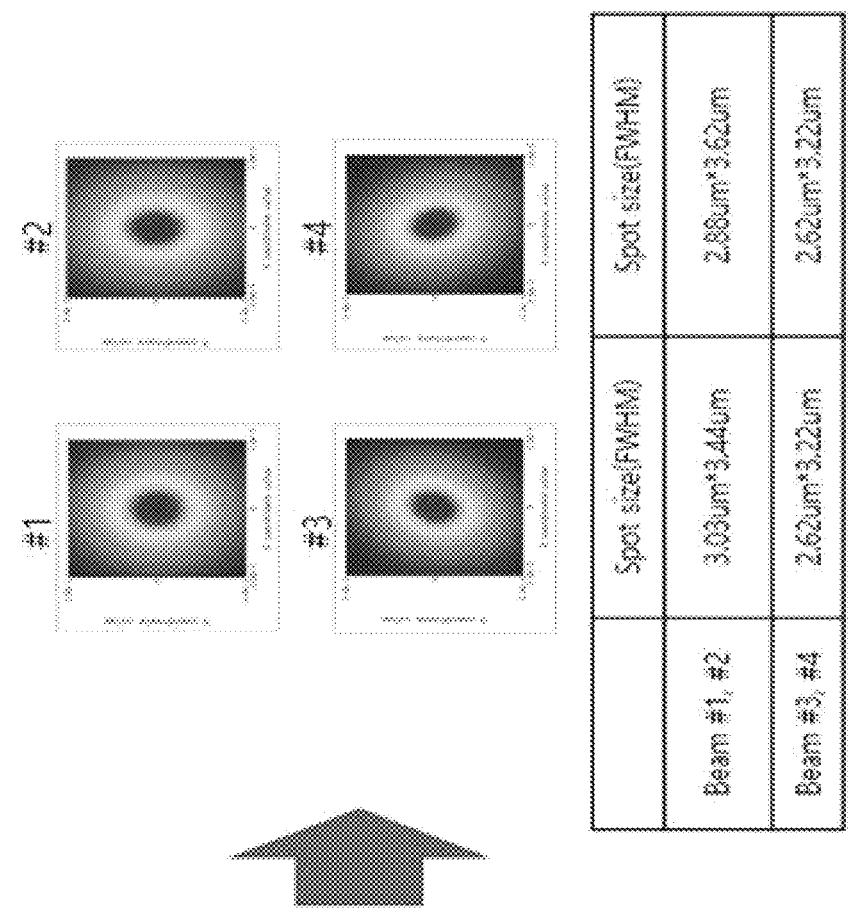
FIG. 7 is a diagram showing illumination light measurement of an illumination light of a high-performance EUV microscope with a free form illumination system according to an embodiment of the present disclosure.
Figure 7:
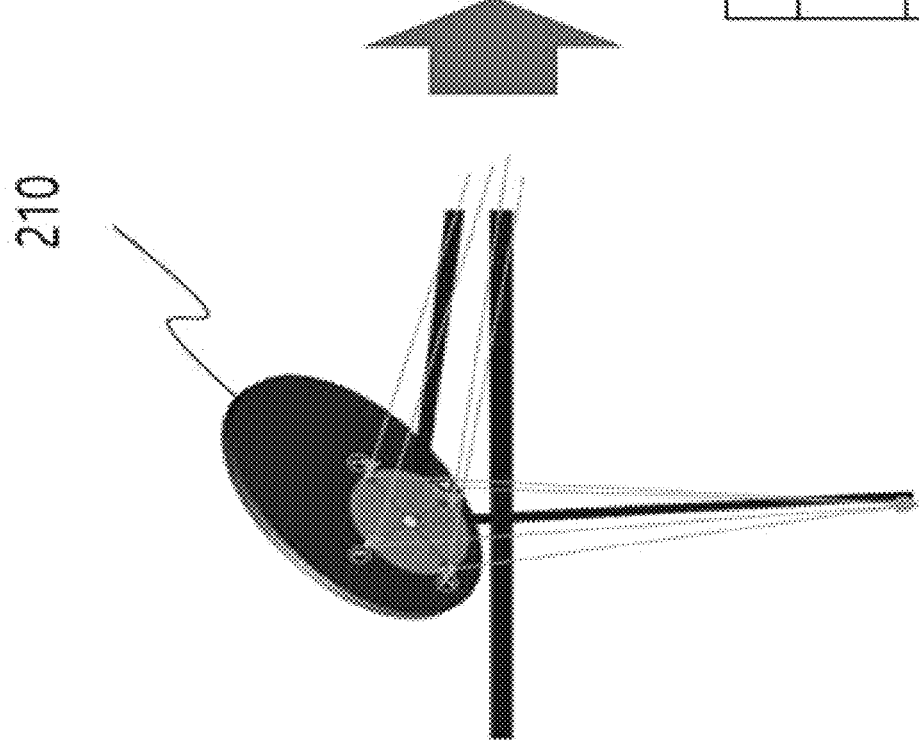

FIG. 7 is a diagram showing illumination light measurement of an illumination light of a high-performance EUV microscope with a free form illumination system according to an embodiment of the present disclosure. According to the embodiment shown in FIG. 7, an EUV microscope device uses an EUV light source with a beam divergence of 0.25 mrad, a source size (FWHM) of 23.8 μm, and a wavelength of to 13.5 μm.

As optical path conditions, distance from a light source (HHG Laser) to a spherical mirror is 1,532.8 mm, distance from the spherical mirror to a plane mirror is 200 mm, and distance from the plane mirror to an EUV mask is 26.0 mm.

Beams were irradiated to first to fourth positions respectively by adjusting angle of the spherical mirror 200 and beams were irradiated to a same position of an EUV mask by adjusting angle of the plane mirror. As a result, spot sizes of first and second beams were 3.03 μm*3.44 μm and 2.88 μm*3.62 μm, respectively, and spot sizes of third and fourth beams were 2.62 μm*3.22 μm and 2.62 μm*3.22 μm, respectively.

According to the present disclosure configured as described above, the existing free form illumination light can be obtained using only a spherical mirror and a plane mirror without using the existing expensive aspheric lens, thereby realizing cost reduction and structure simplification.

In addition, according to the present disclosure, uniformity of illumination can be obtained only by using a spherical mirror and a plane mirror, thereby enabling more precise measurement of an EUV mask.

In addition, according to the present invention, a high-performance EUV microscope device with an illumination system having uniform light intensity can be provided by applying a plane mirror having a mirror cell structure.

Although the present disclosure has been described and illustrated in relation to the preferred embodiments for illustrating the principles of the present disclosure, the present disclosure is not limited to the construction and operation as shown and described. Rather, those skilled in the art will appreciate that a plurality of changes and modifications may be made to the present disclosure without departing from the spirit and scope of the appended claims. Accordingly, all such pertinent changes and modifications and equivalents should be considered as falling within the scope of the present disclosure.

EXPLANATION OF REFERENCE NUMERALS

| | |
|---|---|
| 100: EUV light source | 200: Spherical mirror |
| 210: Plane mirror | 211: Mirror cells |
| 300: Zone plate lens | 500: Photodetector |
| 400: EUV mask | |

What is claimed is:

1. A high-performance EUV microscope with a free form illumination system, comprising:
an EUV light source that outputs EUV light;
one spherical mirror, which receives and reflects the EUV light outputted from the EUV light source and includes a two-axis drive part for controlling reflection direction of incident light through two-axis angle scan;
an optical path change means, which receives the reflected light reflected from the spherical mirror and provides illumination light to a measurement target;
a zone plate lens for focusing measurement light which is incident on the measurement target and then reflected; and
a photodetector for receiving the measurement light focused by the zone plate lens,
wherein reflection direction of reflected light is controlled by rotating the spherical mirror through the drive part, and illumination light irradiated onto the measurement target is controlled through the optical path change means on which the reflected light is incident,
wherein the optical path change means, which receives the reflected light reflected from the spherical mirror and provides illumination light to a measurement target, includes one plane mirror in which a plurality of mirror cells are arranged at each angle,
forms free form illumination light through the plane mirror,
allows the free form illumination to be incident on the measurement target, and
selectively controls a reflection angle of the spherical mirror and a reflection angle of the plane mirror, respectively, so as to control illumination light irradiated to the measurement target.

2. The high-performance EUV microscope with a free form illumination system according to claim 1, wherein
the optical path change means, which receives the reflected light reflected from the spherical mirror and provides illumination light to a measurement target, includes one plane mirror including a drive part for adjusting reflection angle of the illumination light,
forms free form illumination light through the plane mirror,
allows the free form illumination to be incident on the measurement target, and
selectively controls a reflection angle of the spherical mirror and a reflection angle of the plane mirror, respectively, so as to control illumination light irradiated to the measurement target.

3. The high-performance EUV microscope with a free form illumination system according to claim 2, wherein
an angle of the spherical mirror is controlled so that a position of light incident on the plane mirror is controlled, and
an angle of the plane mirror is controlled so that illumination light is irradiated at a same position of the measurement target.

4. The high-performance EUV microscope with a free form illumination system according to claim 1, wherein the EUV light source is an EUV light source based on high-order harmonic generation HHG.

5. The high-performance EUV microscope with a free form illumination system according to claim 1, wherein the plane mirror is driven at a two-dimensional angle so as to scan illumination light for each position of the measurement target.

6. The high-performance EUV microscope with a free form illumination system according to claim 1, wherein the plurality of mirror cells configured in the plane mirror can be controlled in angle so that illumination light of a same angle is irradiated to a same point of the measurement target.

7. The high-performance EUV microscope with a free form illumination system according to claim 6, wherein the plurality of mirror cells are formed so as to be independently controlled in angle so that illumination light reaches a desired position of the measurement target.

8. The high-performance EUV microscope with a free form illumination system according to claim 1, wherein in order to implement a total light illumination time required for measurement with respect to the same point of the measurement target, free form illumination light is formed through a combination of angles of the mirror cells configured in the plane mirror and the spherical mirror.

9. The high-performance EUV microscope with a free form illumination system according to claim 1, wherein in the case of providing illumination light for different points of the measurement target, angles of the mirror cells configured in the plane mirror are controlled in a state in which angle of the spherical mirror is fixed, so as to provide illumination light to different points of the measurement target.

10. The high-performance EUV microscope with a free form illumination system according to claim 1, wherein
- an angle of the spherical mirror is controlled so that a position of light incident on the plane mirror is controlled, and
- an angle of the plane mirror is controlled so that illumination light is irradiated at a same position of the measurement target.

* * * * *